United States Patent [19]
McArthur et al.

[11] Patent Number: 5,929,991
[45] Date of Patent: Jul. 27, 1999

[54] SINGLE PLATE CORRECTOR FOR STEPPER LENS TRAIN

[75] Inventors: Bruce B. McArthur; Adlai H. Smith, both of San Diego, Calif.

[73] Assignee: Litel Instruments, San Diego, Calif.

[21] Appl. No.: 08/813,766

[22] Filed: Mar. 7, 1997

[51] Int. Cl.⁶ ........................................... G01B 9/02
[52] U.S. Cl. ............................ 356/355; 356/359
[58] Field of Search .................... 356/345, 355, 356/359

[56] References Cited

U.S. PATENT DOCUMENTS 5,392,119  2/1995  McArthur et al. ...................... 356/355

*Primary Examiner*—Robert Kim
*Attorney, Agent, or Firm*—Townsend and Townsend and Crew LLP

[57] ABSTRACT

A stepper lens train is mapped for curvature of field and distortion. A single plate, displaced from the reticle plane, is utilized for stepper correction. The plate is provided with a variable thickness mapped to correct curvature of field. The same plate is etched with stepped gratings typically on a flat surface of the plate.

6 Claims, 5 Drawing Sheets

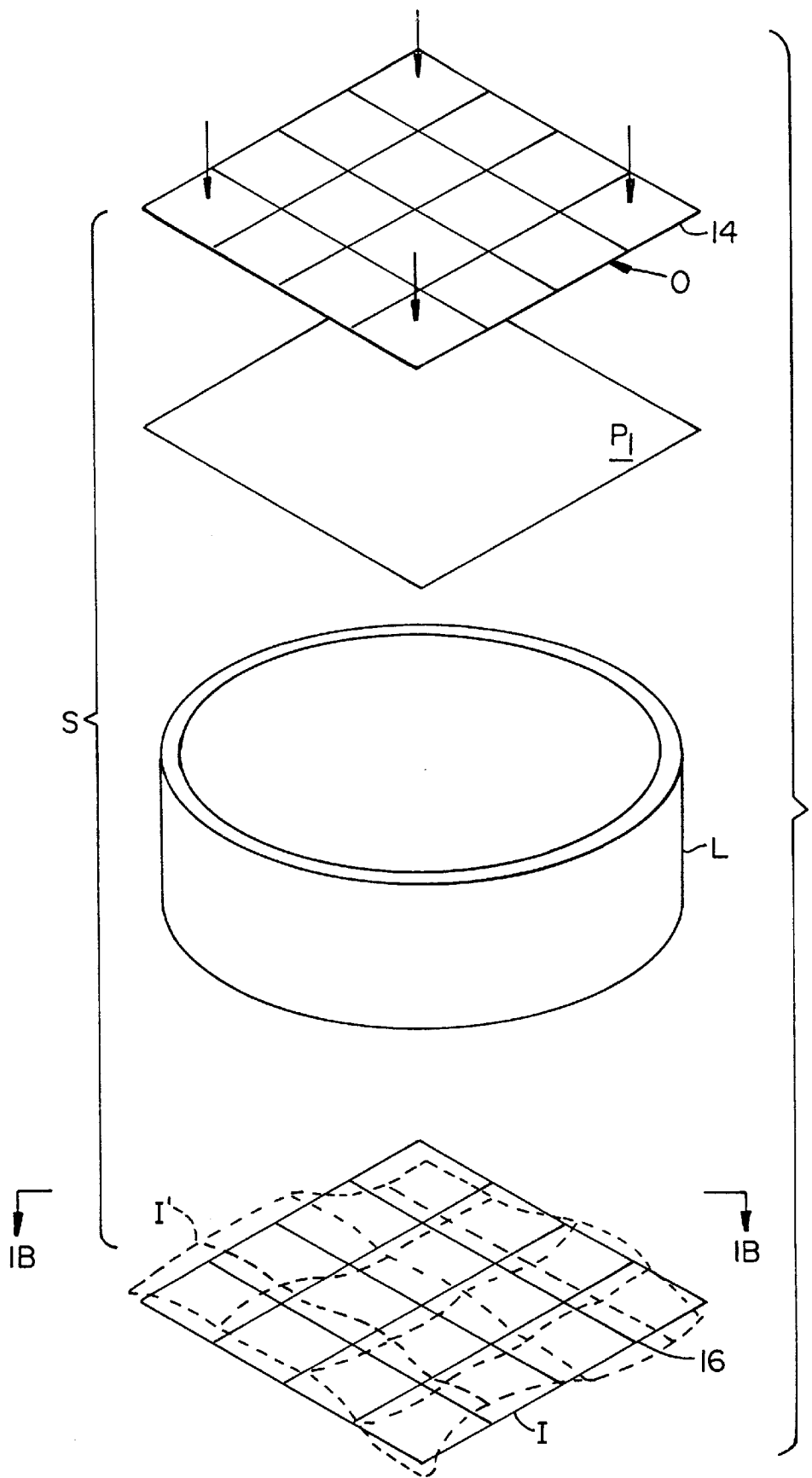

SINGLE PLATE CORRECTOR FOR STEPPER LENS TRAIN

This invention relates to the correction of steppers. More particularly, a single plate corrector is disclosed which includes variable thickness for correction of mapped curvature of field and etched steps for correction of distortion.

BACKGROUND OF THE INVENTION

Modern stepper lens trains are typically designed for the transmission of an image of electronic features to a substrate being processed. Unfortunately, specifications for such images change—the most common change being that the image requires increasingly smaller features fabricated to higher tolerances.

As the specifications change—usually by becoming smaller and more exacting—the requirements of imaging frequently demand upgrading of the stepper optics. Unfortunately, such upgrading frequently necessitates replacement of the stepper—or at least the stepper optics.

Additionally, building a stepper optical train can require exacting placement of conventional classical optics. Accordingly, it would be desirable if error of an optical train built to relatively low tolerance could have the errors of such optical trains mapped and then up-graded to a higher tolerance. Or, alternatively, state-of-the-art imaging objective optics can be improved to perform beyond their intended specifications.

In Plate Correction of Imaging Systems, now U.S. Pat. No. 5,392,119 issued Feb. 21, 1997, stepper correction utilizing two plates is disclosed. In this patent, two planes are taken through the stepper optical train. Taking an "ideal" reticle broadcasting its image to an "ideal" image to be produced by the stepper optical train, first mapping the ideal image to a corrected reticle image occurs which displaces the corresponding reticle points in accordance with the field curvature and distortion of the mapped stepper system. Thereafter, the first plate is given sufficient displacement to deviate light from the displaced reticle points to coincidence to a perfect ray trace path at the second corrector plate. At the second corrector plate, the light rays will be in coincidence to—but not necessarily have proper direction to—their corresponding points on the ideal image. Consequently, at the second corrector plate, deviation of the light occurs to deflect the direction of the light into coincidence to a "perfect" ray trace path to an ideal image. Correction of the optical stepper results. This Patent is incorporated by reference to this application as if set forth fully herein.

In Plate Correction Technique for Imaging Systems, U.S. patent application Ser. No., 08/592,703 filed Jan. 26, 1996, again two corrector plates are utilized. In this system a stepper configuration is modified by corrector plates so that an image from a reticle plane is projected to an ideal image at an object plane. The preferred location of plates correcting for curvature of field is at the reticle plane, it being noted that distortion introduced by a field corrector plate at this location is generally negligible. Three generalized cases for correction are therefore discussed. The first case is field curvature correction where the correcting plate is registered to or close to the reticle plate; it is shown that induced distortion correction may generally be ignored. The second case is where field curvature correction cannot be placed next to the reticle plate, but the field curvature induced by required distortion correction is negligible. Finally, the case is considered where field curvature induced by the correction of distortion is not negligible and must be compensated for in overall correction. This disclosure is a technique for 2-plate correction of imaging systems with greatly increased ability to correct for curvature of field. General formulas can be derived for n-plate correction using this same technique. This Application is incorporated hereto by reference as if fully set forth herein.

In the present disclosure, stepper correction has been reduced to a single plate.

SUMMARY OF THE INVENTION

A stepper lens train is mapped for curvature of field and distortion. A single plate, displaced from the reticle plane, is utilized for stepper correction. The plate is provided with a variable thickness mapped to correct curvature of field. The same plate is etched with stepped gratings typically on a flat surface of the plate. These stepped surfaces are computer generated holograms (CGH) with 16 levels. Putting all of the corrections on a single plate fixes the relative alignment of the correcting plates and therefore eliminates any plate-to-plate offset as a source of misalignment. The single plate is more physically compact and so can fit into restricted spaces.

BRIEF DESCRIPTION OF THE DRAWINGS

FIG. 2A is an optical schematic of the mapped curvature of field and distortion of the stepper optical train of FIG. 1;

DESCRIPTION OF THE PREFERRED EMBODIMENT

Figure 1:
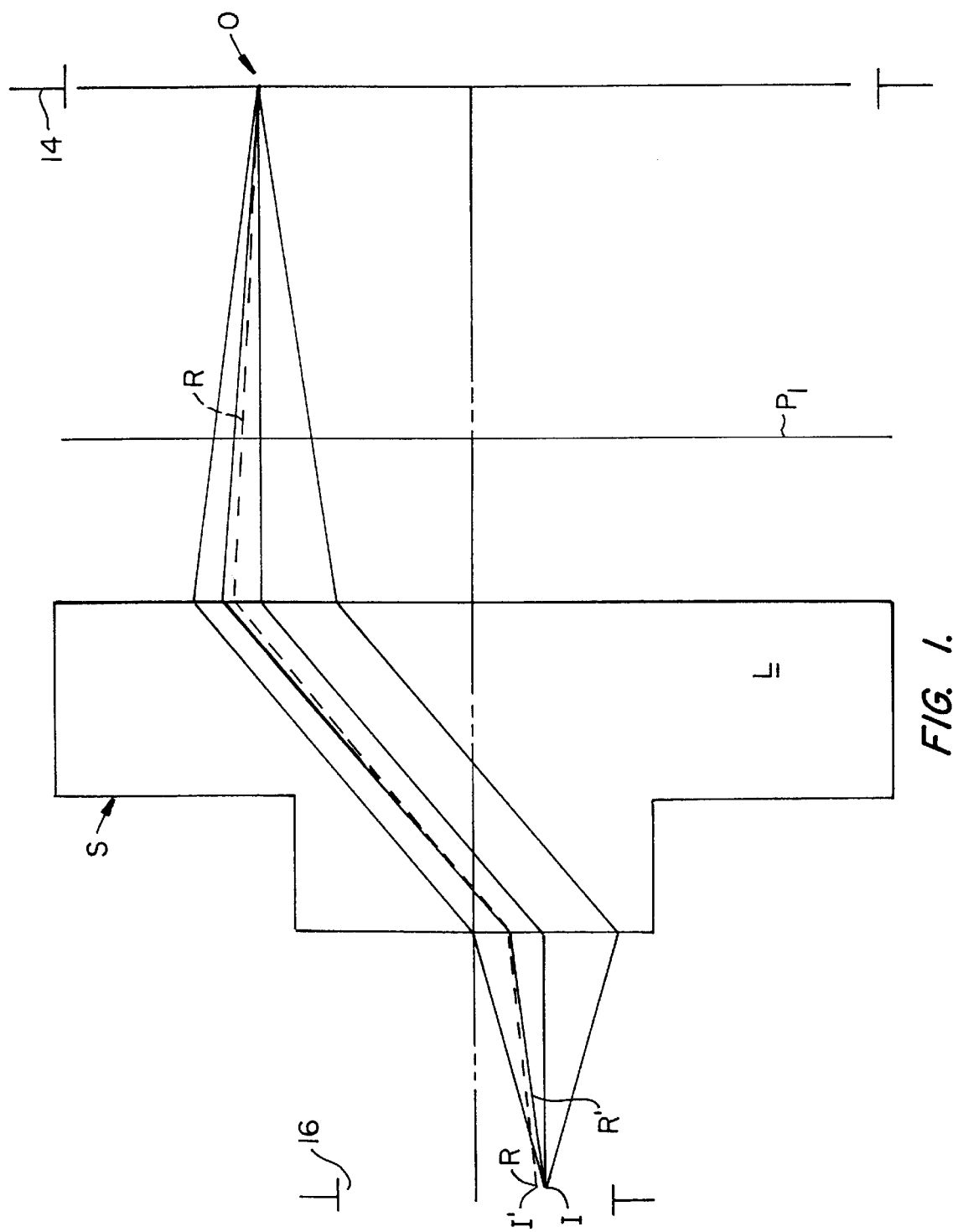
FIG. 1 is a schematic of a stepper optical train of the image reducing variety illustrating a reticle image having a size approximately five times as large as the ideal image to be projected and illustrating a corrector plate plane.

Referring to FIG. 1, a schematic of reduction stepper S is illustrated. Simply stated, lens system L takes image information from object O at reticle plane 14. The light is then relayed through lens system L to image plane 16. Presuming that corrector plate $P_1$ of this invention is not present, actual image point I' is displaced from ideal image point I. Consequently, it is the purpose of corrector plate $P_1$ to cause rays R to be diverted from their path from actual image point I' to ideal image point I.

Turning to FIG. 2A, a schematic of the problem encountered by this invention is set forth. Object O from reticle plane 14 is shown. This plate typically has the image information that it is desired to broadcast through reduction stepper S including lens system L. In the absence of corrector plate $P_1$, error will occur at image plane 16. Specifically, instead of ideal image points I occurring, actual image points I' will occur with two types of errors.

First, actual image points I' will be above or below image plane 16. This problem is known as curvature of field; it is a field position dependent focal error.

Figure 2B:
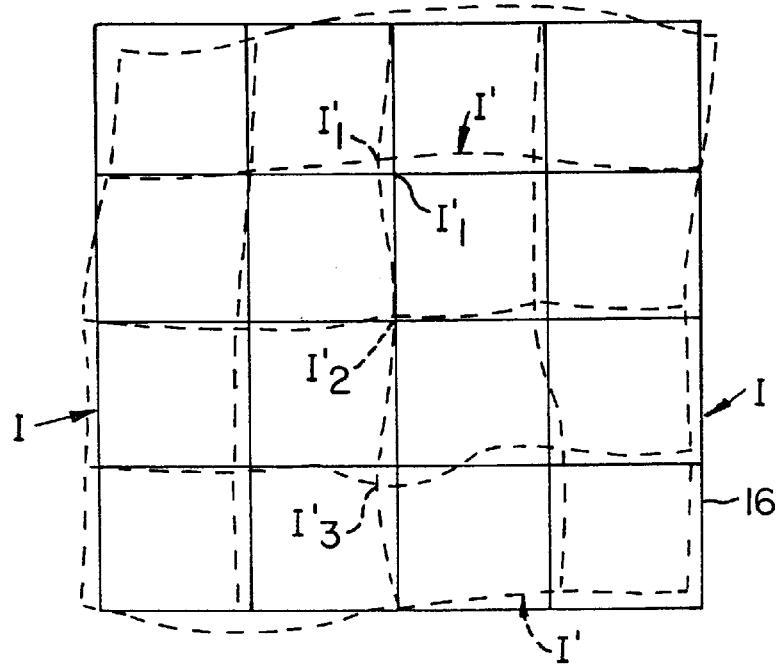
FIG. 2B is a plan view of the mapped distortion of the stepper of FIGS. 1 and 2A.

Second, and as more clearly shown in FIG. 2B, image points will be displaced within image plane 16. Thus it can be seen that first actual image point I'$_1$ is displaced from first ideal image point I$_1$. Similar displacements can be observed for I$_2$ and I$_3$.

Returning to FIGS. 2A and 2B, it will be seen that this error repeats itself. Further, the error here is random and generally not circularly symmetric. Each lens train will have its own errors—and those errors will be unique to that particular lens system. These errors are typically the result of inevitable build-up fabrication and assembly errors that are not readily correctable by further tightening of fabrication tolerances or assembly procedures. Thus it will be understood that the process here disclosed includes mapping the curvature of field and distortion for a lens system and thereafter correcting the depth of field and distortion.

Just as the curvature of field varies with random error throughout the field of lens system L of reduction stepper S, so the thickness of corrector plate P$_1$ will vary with random error. This variation is gradual over the field and schematically illustrated in FIG. 3.

Unfortunately, the gradual variations in plate thickness for the correction of curvature of field have further input to distortion. This further input to distortion has to be corrected. It turns out that if corrector plate P$_1$ is near reticle plane 14, these inputs to distortion are minimized. However, for most cases, distortion must be corrected for both that distortion due to the presence of lens system L and that distortion present due to the variable change of thickness T$_1$, T$_2$, and T$_3$.

The same is not true for distortion corrections. Normally these corrections are so small that changes in plate thickness of corrector plate P$_1$ are negligible as far as inducing curvature of field change. Because of this small curvature of field change, we ignore this error.

On the single plate here utilized, the correction of curvature of field is straightforward. Specifically, curvature of field error is conventionally mapped. Typically a grid is utilized. Best focus at a grid of points is determined by exposing wafers at an array of planes covering the variation of field curvature. The plane producing best focus for a grid point determines the field curvature at that point.

*Latent Image Metrology for Production of Wafer Steppers* by P. Dirksen, W. de Laat and H. Megens of the Phillips Research labs, Prof Holstlaan 4, 5656 A A Eindhoven, The Netherlands, describes a latent method image methodology for rapidly obtaining curvature of field data. Other techniques such as FORECAST from *A Simple and Calibratatable Mehtod for the Determination of Optimal Focus* by J. W. Gemmink of Phillips Research Laboratories, POBox 80000, 5600 Eindhoven, The Netherlands, (see SPIE Vol. 1088 Optical/Laser Microlithography II (1989)) can also be used. Variation of image plane 16 towards and away from lens system L occurs. A map of curvature of field not at all unlike that shown in FIG. 2A occurs; the exception is that this produced array of points is generally much larger.

Distortion is measured by a similar process. Ideally, actually projected regular points are compared to known ideal projection points at image plane 16. A map of distortion results. There are a variety of methods known in the art for determining the distortion. Precision coordinate measuring machines such as the Leica LMS2020 or Leica 5I can be used. *Electrical Methods for Precision Stepper Column Optimization* by Ludwik J. Zych, Gianpaolo Spadini of VLSI Technology, Inc, 1101 McKay Dr., San Jose, Calif. 95131, and Talat F. Hasan and Beth A. Arden of Prometrix Corp., 3255 Scott Blvd, Bldg2, Santa Clara, (SPIE Vol. 633 Optical Microlithography V (1986)) describes an electrical method that can be used.

Figure 3:
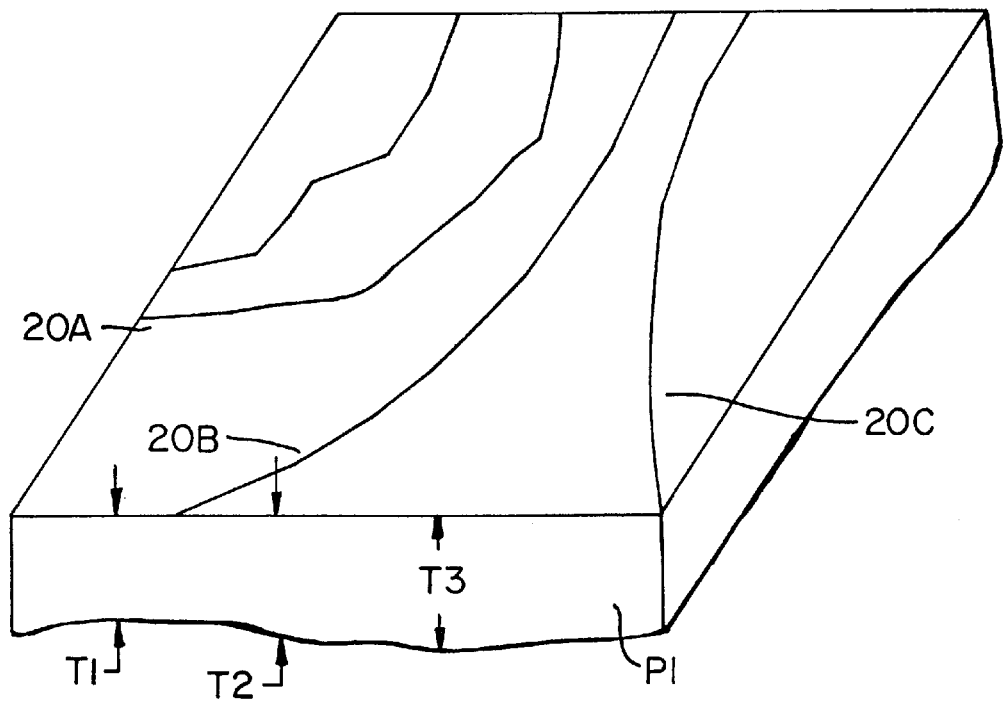
FIG. 3 illustrates a corrector plate of this invention for correcting curvature of field, distortion, and curvature of field induced distortion.

FIG. 3 shows in distorted scale the plate of this invention. Correction for error occurring due to distortion is shown at steps 20$_A$, 20$_B$, and 20$_C$. In the normal construction of corrector plate P$_1$, variable thickness is typically etched on continuously corrected side 26 of the corrector plate with steps being placed on the opposite or "flat" side of the corrector plate. Plate thickness corrects for depth of field error; the steps correct for distortion.

An additional advantage of the present invention is its increased tolerance to fabrication errors. Specifically, sufficiently large errors in the slope of continuously contoured side 26 lead to noticeable distortion errors in the projected image. Thus side 26 could be contoured to correct for field curvature within the allowed-for margin but have unacceptable slope errors. In the construction of the plate, these slope errors are ameliorated by accurately measuring the plate thickness and then the effect of the as-measured slope errors is corrected for on the grating side. Thus if T=T(x,y) is the thickness of the as-contoured plate and ø=ø(x,y) is the phase applied to grating side 28 then the distortion, D, introduced by plate P1 is:

$$D = \frac{z(n-1)}{M^2}\nabla(T) + \frac{\lambda z}{M^2}\nabla(\phi) \quad (1)$$

where:

$\nabla$ is the 2-dimensional gradient operator, z is the distance from recticle to corrector plate P1, $\lambda$ is wave length of the light, n is the index of refraction of the corrector plate, ø is phase applied to grating side in waves, M is magnification of the image reduction system.

So if we first calculate ø as the phase required to correct the distortion not accounting for the thickness variation, then the phase we apply to side 28 of plate P1 is:

$$\phi --> \phi' = \phi - \frac{(n-1)}{\lambda} * T \quad (2)$$

Figure 4:
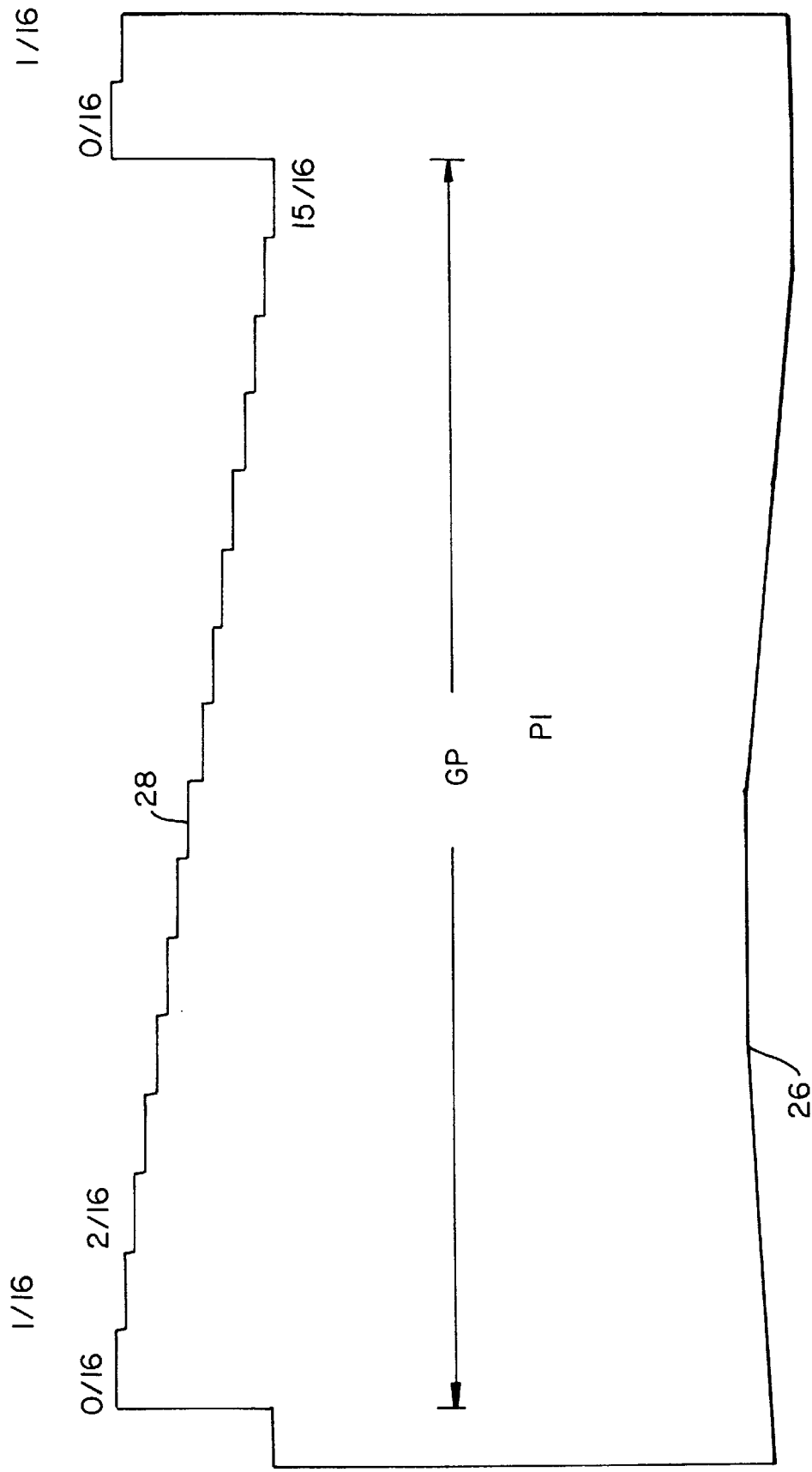
FIG. 4 illustrates a schematic cross section of correction plate P1.

Referring to FIG. 4, a schematic cross section of corrector plate P$_1$ is illustrated. It includes variable plate thickness side 26 and stepped surface side 28.

Some attention can be directed to variable plate thickness side 26 and the total variation of thickness required. For older model steppers, around 70 microns deep will be the typical total contour depth variation of the corrector plate. Newer steppers do not have as much field curvature. They typically only need about 30 microns of depth variation.

It will be understood that distortion correction on corrector plate P$_1$ requires relatively small optical power. Presuming that one is making these corrections with gratings, the usual binary half wave steps utilized with binary diffractive optics are inadequate. Specifically, we must utilize steps having ½, ¼, ⅛th, ¹⁄₁₆th wave retardation. These will all be placed in the glass in combination to cover the range from ⁰⁄₁₆ to ¹⁵⁄₁₆ths wave retardation at every ¹⁄₁₆th interval.

For example, if you want the ³⁄₁₆th, you would add ¹⁄₁₆th and ⅛th. With both in X,Y position produces the desired value.

It will be understood that we would make the various thickness in four discrete steps. These steps include etching ¹⁄₁₆th wave corrections, etching ⅛th wave correction, etching ¼ wave corrections and finally etching ½ wave corrections. Because of the precision overlay required for high diffraction efficiency, contact lithographic methods for producing the plates are not preferred even though they could be used. Instead, direct write multilayer electron beam lithography would be utilized in fabricating the layers. Alternatively, 15 etching steps could be utilized to produce the required 16 levels.

A multiple level etch technique that can accomplish this purpose is known. Specifically, and as set forth in U.S. patent application Ser. No. 08/538,153 filed Oct. 2, 1995 entitled Multilayer E-Beam Lithography on Non-Conducting Substrates, a technique is set forth which enables precision multilayer E-beam lithography to the tolerances required here.

Utilizing this technique, the respective layers are transversely aligned one with respect to another to about 0.1 micron or less to produce the desired result.

Some attention can be addressed to the thickness of the steps. Usually, monochromatic light is utilized having a wave length in the order of about 0.365 microns. It will be understood that we must induce up to $15/16$ths of the 0.365 microns wave length retardation. Due to the high homogeneity and surface qualities achievable, fused silica is the preferred plate material. Utilizing fused silica to retard the wavefront by $\lambda=0.365$ microns, the index of refraction n being n=1.47, the etch depth required for 1 wave retardation is $d=\lambda/(n-1)=0.78$ microns. For a 16 phase level mask the individual step depths would be d/16=0.049 microns while the largest discontinuity on grating surface 28 would be the $15/16*d=0.73$ micron.

Having set forth these dimension, it can be understood why there is no appreciable curvature of field correction arising from the required steps. The etch depth d itself introduces a modulation in field curvature:

$$\text{Field Curvature}=+/-\frac{1}{2}*(n-1)*15/16*d/M^2 \quad (3)$$

equal to +/−0.007 micron or approximately 2% of the entire depth of field. Therefore, curvature of field from the distortion correcting steps can be effectively ignored.

We prefer to use fused silica. It will be understood that other materials can be used. Examples include, but are not limited to, BK7, other forms of $SiO_2$ such as fused quartz, CaF, LiF, BaF, or any of the glasses that are spectrally transmissive in the region of interest or found in the Schott optical glass catalog.

FIG. 4 illustrates a schematic cross section of Correction plate, $P_1$, fabricated with conventional gratings operating in the first or +1 order. Sixteen (16) levels are illustrated. Swanson describes the theory and operation of such first order gratings. Surface 28 is contoured with a 16 level grating while surface 26 is continuously contoured. If ø is the correction phase required for on surface 28 then for a first order grating the depth it is etched to will be determined by the following formula:

$$\alpha = \phi \mod 2\pi \; (-2\pi, 0) \text{ range}$$

etch level=j/N if $-(2j+1)*\pi/N < \alpha < = -(2j-1)*\pi/N$ for $j=1,2 \ldots, N-1$ etch level=0 otherwise In the above, phase ø is measured in radians.

Figure 5:
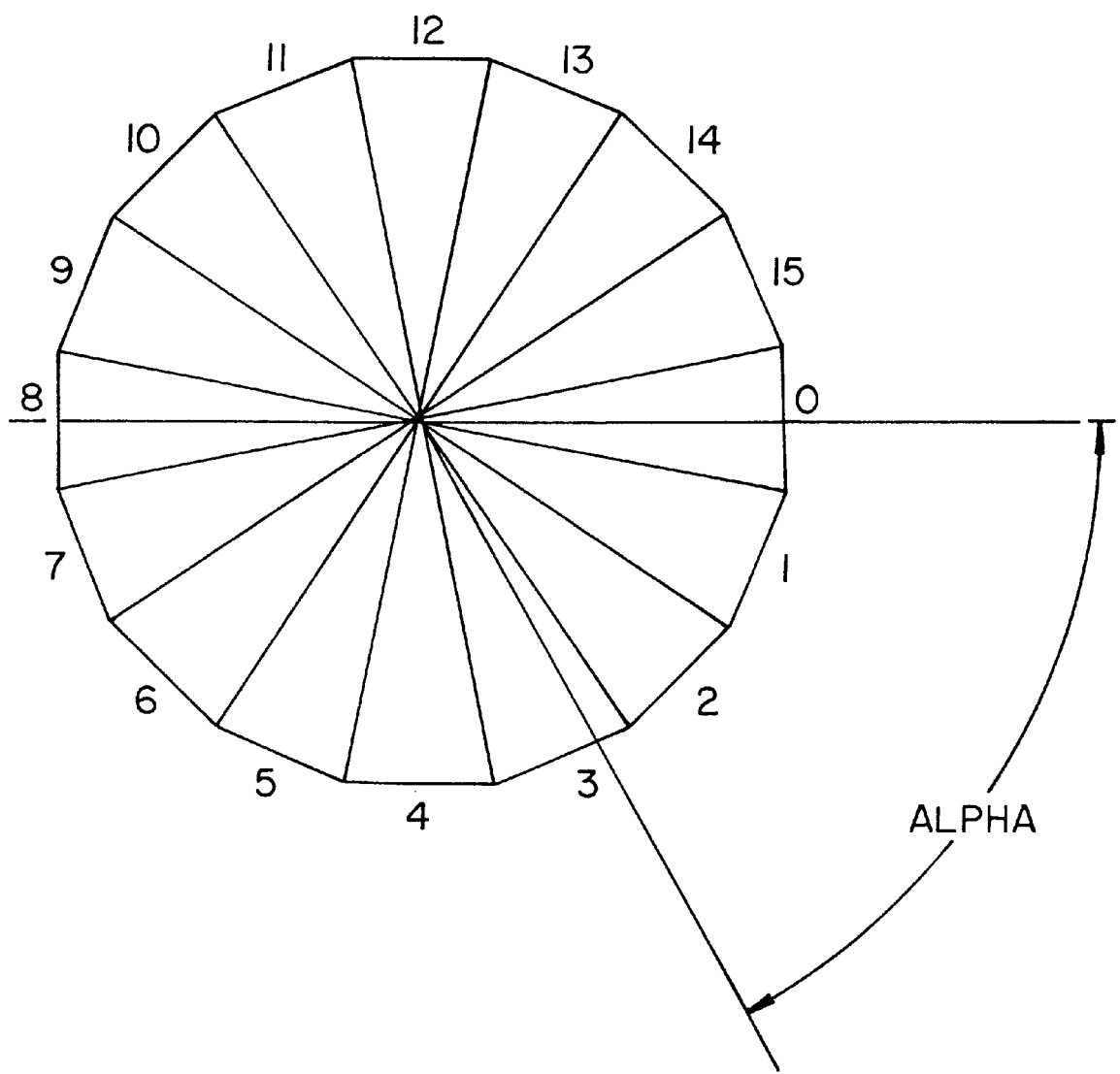
FIG. 5 is a graphical interpretation of equation (1).

This formula is illustrated by FIG. 5. The angular space is divided into N=16 sectors labeled 0,1 . . . 15, respectively. If the phase ø (=α when reduced mod 2π) is within the respective sector (=j), the etch depth on the corresponding step is etched to a retardation of j/N=j/16 wave.

ø as determined by the requirement of distortion and field curvature alone in general will have locations where its transverse derivatives vanish, e.g.

$$\text{grad } \phi = (d\phi/dx, d\phi/dy)=0$$

The local distortion or distortion correction induced by the grating is:

$$D = \frac{\lambda * z}{M^2} * \nabla(\phi) \quad (4)$$

In equation (4) the following symbols take on the following meaning and values:

| Symbol | Meaning | Nominal Value |
|---|---|---|
| z | distance from corrector plate Pl to reticle 14 | 7 mm |
| λ | actinic wave length used for projection | 0.365 micron |
| M | M:1 imaging reduction ratio | 5 |
| φ | phase (waves) added to light by the grating 28. | |

Because a first order grating is being used, the orders other than +1 produced by the grating are passed by the imaging objective. These orders interfere with one another according to coefficients determined by the transverse spatial coherence of the light incident on the reticle which in turn are a function of |grad ø|. The exact relationship is rather complicated but the conclusions of an analysis carried out along these lines is rather simple.

The illumination was examined for the cases of solid underfilled pupil, annular underfill, elliptical annulus, and dipole filling of the pupil. Provided |D|>Dth is a threshold value generally—~100 nm, then negligible residual distortion (<1 nm) is introduced. This is accomplished by adding a suitable tilt term to the phase applied to surface 28. That is, $$\phi \rightarrow \phi' = \phi + a*x + b*y \quad (5)$$

where a and b are chosen so, $$|D|=|\lambda*z/M^2 \text{ grad}(\phi)|>Dth \quad (6)$$

The effect of this linear phase term is a constant offset of the projected image which is readily compensated for by shifting the entire wafer. Since this constant offset is built into correction plate P1, it is permanent and its effect needs to be compensated for in the wafer alignment system. In the case of the ASM/100 series wafer steppers, a precision wedge is introduced into the two red HeNe alignment paths whose effect is to nominally remove offsets caused by this additional grating tilt.

Summarizing, the step for creating a stepper correction plate according to this invention are:

1) Measure the distortion and field curvature at a number of points.

2) Determine the mechanical location of the correction plate in the stepper beamtrain.

3) Solve for the required plate contours according to the equations of case 3 in Plate Correction Technique for Imaging Systems, U.S. patent application Ser. No., 08/592,703 filed Jan. 26, 1996.

4) Fabricate the continuously contoured or field curvature side of the plate.

5) Interferometrically determine the thickness, T, of the plate.

6) Calculate the phase, ø, applied to grating side, 28, according to:

$$\phi = \phi1 - (n-1)\lambda^* T + a^* x + b^* y \tag{7}$$

where ø1 is the phase as calculated in step 3, T the plate thickness as determined in step 5, and a and b are constants determined so that $|\lambda^* z/M^2 \; grad(\phi)1 > Dth$.

7) With the phase, ø, determined in step 6, and using successive lithographic and etching steps as described in "Multilayer E-beam Lithography on Non-conducting Substrates" a (preferably) 16 level grating is fabricated on side 28. Other numbers of levels could be used if their diffraction efficiency is acceptable.

This invention has been described in reference to an imaging objective consisting of refractive lenses. This was for concreteness only; in general this invention could be utilized with general imaging objectives of the reflective, refractive, catadioptric, diffractive, or combinations of these elements comprising the imaging objective.

The plate itself has been described as transmissive. With only minor modification a catadioptric plate consisting of one grating and one continuously contoured side, either side being reflectively coated, could be made.

The plate herein described has a diffractive component consisting of discrete steps etched in gloss or fused silica. It is possible to replace the discretely stepped surface with one consisting of smooth profiles, the only discrete transitions occurring having the effect on the wavefront of shifting it an integral number of wave lengths. Such gravities have been fabricated in E-beam resist, photoresist and transferred into glass. Thus, the gravity side of this invention could consist of an optically suitable overcoating patterned as described above or the same type of pattern impressed into the glass or fused silica surface.

What is claimed is:

1. In a corrector plate for insertion to an optical train a position with respect to the optical train for intercepting and correcting all light of a preselected wave length passing through the optical train for correcting measured curvature of field and distortion of a projected image for a preselected wave length of operation, the corrector plate including:

a plate having variable thickness mapped with respect to the measured curvature of field to produce optical plane wave flattening to correct the measured curvature of field;

the corrector plate including at one surface thereof computer generated holograms having optical steps of less than one wave length of the preselected wave length of operation, the optical steps having a component of light deflection producing an offset of the projected image to correct residual distortion from interference of orders other than the +1 order plus system required distortion correction for the optical train.

2. An optical system including in combination:
    an object plane for placing an object to be imaged;
    an image plane for placing material to receive an image;
    a lens train for projecting an image of the object to the image plane in light of a preselected wave length, the lens train imparting random curvature of field and distortion to the image of the object;
    means for mounting a corrector plate to said lens train for processing all light of the preselected wave length passing through the lens train;
    a plate having variable thickness mapped with respect to the measured curvature of field to produce optical plane wave flattening to correct the measured curvature of field;
    the corrector plate including at one surface thereof computer generated holograms having optical steps of less than one wave length of the preselected wave length of operation, the optical steps having a component of light deflection producing an offset of the projected image to correct residual distortion from interference of orders other than the +1 order plus system required distortion correction for the optical train.

3. A method of generating a corrector plate for insertion to an optical train at a position with respect to the optical train for intercepting and correcting all light of a preselected wave length passing through the optical train for correcting measured curvature of field and distortion for a preselected wave length of operation, the method of generating the corrector plate comprising the steps of:

measuring depth of field error for the optical train;
    measuring distortion for the optical train;
    determining a location for mounting a single corrector plate to the optical train;
    providing a plate having variable thickness mapped with respect to the measured curvature of field to produce optical plane wave flattening to correct the measured curvature of field;
    providing the corrector plate to include at one surface thereof computer generated holograms having optical steps of less than one wave length of the preselected wave length of operation, the optical steps having a component of light deflection producing an offset of the projected image to correct residual distortion from interference of orders other than the +1 order plus system required distortion correction for the optical train.

4. A corrector plate for insertion to an optical train according to claim 1 wherein the offset of the projected image is greater than 100 nanometers.

5. The optical system of claim 2 wherein the offset of the projected image is greater than 100 nanometers.

6. A method of generating a corrector plate for insertion to an optical train according to claim 3 wherein the offset of the projected image is greater than 100 nanometers.

\* \* \* \* \*